United States Patent [19]

Gadian et al.

[11] Patent Number: 4,728,889

[45] Date of Patent: Mar. 1, 1988

[54] SPECTROSCOPY METHOD

[75] Inventors: David G. Gadian, Holcot; Edward Proctor, Horsham; Stephen R. Williams, London, all of England

[73] Assignee: Picker International, Ltd., Wembley, England

[21] Appl. No.: 893,692

[22] Filed: Aug. 6, 1986

[30] Foreign Application Priority Data

Aug. 16, 1985 [GB] United Kingdom ............... 8520587

[51] Int. Cl.$^4$ ............................................. G01R 33/20
[52] U.S. Cl. ...................................... 324/307; 324/311
[58] Field of Search ........................ 324/311, 307, 300

[56] References Cited

U.S. PATENT DOCUMENTS 4,081,742 3/1978 Hofer et al. ........................... 324/307

OTHER PUBLICATIONS

Rothman, D. L. et al., "Homonuclear $^1$H Double-Resonance Difference Spectroscopy of the Rat Brain in Vivo", Proc. Natl. Acad. Sci. U.S.A., vol. 81, pp. 6330–6334, Oct. 1984.
Williams, S. R. et al., "Proton NMR Studies of Muscle Metabolites in Vivo", J. Magn. Reson., 63, 406–412 (1985).
Campbell, I. D. et al., "The Application of High Resolution NMR to Biological Systems", Meth. Biochem. Anal., 25, 1 (1979).
Hore, P. J., "Solvent Suppression in Fourier Transform Nuclear Magnetic Resonance", J. Magn. Reson. 55, 283 (1983).
Brindle, K. M. et al., "$^1$H NMR Measurements of Enzyme-Catalyzed $^{15}$N-Label Exchange", J. Magn. Reson. 56, 543 (1984).
Hetherington, H. P. et al., "$^1$H Homonuclear Editing of Rat Brain Using Semi-selective Pulses", Proc. Natl. Acad. Sci. U.S.A., 82, 3115 (1985).
Morris, G. A. et al., "Selective Excitation in Fourier Transform Nuclear Magnetic Resonance", J. Magn. Reson. 29, 433 (1978).
Bodenhausen, G. et al., "Suppression of Artifacts in Two Dimensional J. Spectroscopy", J. Magn. Reson. 27, 511 (1977).
Bendall, M. R. et al., "Depth and Refocusing Pulses Designed for Multipulse NMR with Surface Coils", J. Magn. Reson. 53, 365 (1983).
Sorensen, O. W. et al., "Product Operator Formalism for the Description of NMR Pulse Experiments", Prog. Nucl. Magn. Reson. Spectrosc. 16, 163 (1983).
Beher, K. L. et al., "High-Resolution $^2$H Nuclear Magnetic Resonance Study of Cerebral Hypoxia in Vivo", Proc. Natl. Acad. Sci. U.S.A., 80, 4945 (1983).
Williams, S. R. et al., "A Method for Lactate Detection in Vivo by Spectral Editing without the Need for Double Irradiation", J. Magn. Reson., 66, 562 (1986).

Primary Examiner—Stewart J. Levy
Assistant Examiner—Lawrence G. Fess
Attorney, Agent, or Firm—Timothy B. Gurin

[57] ABSTRACT

An NMR spectroscopy method monitors a component of a sample, the component having two resonances in coupled together different spectral regions. The first resonance lies in a region including a resonance of a second component of a sample while the second resonance lies in a spectral region including a resonance of a third component of the sample. Two spin-echo pulse sequences each consisting of pulses of a predetermined frequency are applied, the spin-echo resonance spectra together being used to obtain the second resonance of the first component with the resonance of the third component suppressed.

8 Claims, 3 Drawing Figures

SPECTROSCOPY METHOD

This invention relates to spectroscopy methods. In particular the invention relates to Nuclear Magnetic Resonance (NMR) spectroscopy methods.

In such methods it is often necessary to employ 'spectral editing' techniques in order to enable resonances of a particular component of a sample being analysed by NMR spectroscopy to be picked out from a spectral region including additional, possibly much stronger resonances from another component of the sample. In addition it may be necessary to suppress dominant resonances in other spectral regions, e.g. large solvent peaks. A method which combines these requirements is described in Proc., Natl. Acad. Sci. USA, Volume 82, pages 3115–3118, published in May, 1985. this publication describes the picking out of the $\beta$-CH$_3$ doublet resonance of lactate at 1.33 ppm from the brain of a dead rat, the brain including a large amount of water, and also a quantity of alanine. The method includes the use of two $1\bar{3}3\bar{1}$ solvent suppression spin-echo pulse sequences. In each sequence excitation pulses at the $^1$H excitation frequency for the particular applied magnetic field are applied as follows:

$$(\alpha - T - \overline{3\alpha} - T - 3\alpha - T - \overline{\alpha}) - t - (2\alpha - T - \overline{6\alpha} - T - 6\alpha - T - \overline{2\alpha}) - t - \text{acquire}$$

where t is the time delay involved in forming the spin echo, and $\alpha$ is the individual excitation angle, alternate individual pulses having opposite phase. The spin-echo spectrum is recorded during each acquisition period. The value of the time interval T between each pair of individual pulses is chosen such that each sequence creates a final spectral pulse power distribution in which an excitation null is produced in the spectral region including the water resonance, this spectral region also including the lactate quartet resonance at 4.11 ppm. During the second half of one of each set of two pulse sequences a selective DANTE pulse at the resonance frequency of the lactate resonance at 4.11 ppm is also applied, such that by appropriate choice of the value of t the lactate doublet resonance at 1.33 ppm is inverted, this inversion arising as a result of the spin-spin coupling interaction between the CH$_3$ and CH protons in lactate.

Thus by subtracting the spectra for each set of two sequences other resonances within the spectra cancel to leave the lactate resonance.

The method described in the above publication has the disadvantage, however, that it is necessary to irradiate the sample at two different frequencies with differing power requirements, this necessarily requiring a more complex NMR spectroscopy apparatus than if the sample need only be irradiated at a single frequency, particularly as the DANTE pulse must be within a particularly narrow bandwidth.

It is an object of the present invention to provide an NMR spectroscopy method capable of performing a similar spectral editing function to the above described method, but avoiding the use of irradiations at different frequencies.

According to the present invention an NMR spectroscopy method for monitoring a component of a sample, the component having at least two coupled resonances in different spectral regions, the first resonance lying in a first spectral region including a resonance of a second component of the sample, and the second resonance lying in a second spectral region including a resonance of a third component of the sample, comprises: applying two spin-echo pulse sequences consisting of pulses of a predetermined frequency, the sequences each being effective to produce a suppressed resonance signal in the first spectral region, in one of the sequences the echo pulse not exciting the first resonance, and in the other of the sequences the echo pulse exciting the first resonance; measuring spin-echo resonances after each of the sequences; and using the two spin-echo resonances together to obtain the second resonance of the first component with the resonance of the third component suppressed.

In one particular method in accordance with the invention the excitation pulses of both sequences and the echo pulse of said one sequence are all effective to produce an excitation null in the first spectral region, and effective to excite resonance in the second spectral region, the echo pulse of said other sequence being effective to invert the resonances of the first component but not the resonance of the third component.

One NMR spectroscopy method in accordance with the invention will now be described, by way of example only, with reference to the accompanying drawings in which.

The method to be described is designed to pick out the lactate doublet resonance at 1.33 ppm, in the particular sample used this resonance lying in the same region as a large fat resonance arising from the scalp and fur of the rat, the spectra also including a dominant water resonance at 4.7 ppm.

The method comprises applying a homogeneous magnetic field effective to define an equilibrium axis of magnetic alignment within the rat brain, and using a surface coil to apply $^1$H excitation pulses to the rat brain in the spin-echo sequence:

$$(\alpha - T - \overline{3\alpha} - T - 3\alpha - T - \overline{\alpha}) - t - (2\alpha - T - \overline{6\alpha} - T - 6\alpha - T - \overline{2\alpha}) - t - \text{acquire}$$

followed by a sequence at the same frequency of the form:

$$(\alpha - T - \overline{3\alpha} - T - 3\alpha - T - \alpha) - t - (16\alpha) - t - \text{acquire}$$

a resonance spectrum being recorded during the acquisition period for each sequence.

The excitation pulse within each sequence, i.e. the total of the individual pulses applied before the first time period t, comprises a so-called solvent suppression pulse, the value of T being chosen such that it is effective to cause an excitation null in the spectral region of the water resonance, this region as referred to above also including the lactate quartet resonance at 4.11 ppm. The excitation pulse does, however, excite resonance outside this region, such that after the pulse the spins of the fat component which are $\frac{1}{2}$T off resonance, together with the spins of the $\beta$-CH$_2$ bound lactate component of the brain will rotate in a plane normal to the equilibrium direction of magnetic alignment.

The echo pulse of the second sequence differs from that of the first sequence however in that whilst the echo pulse of the first sequence is a further solvent suppression pulse this is replaced in the second sequence by a pulse which inverts the spins within the spectral region in the excitation null. Because the lactate quartet resonance is coupled to the lactate doublet resonance, the lactate doublet resonance at 1.33 ppm will also be inverted, whilst the fat resonance in the same spectral region to the lactate doublet resonance will be unaffected. As however the second solvent suppression pulse in the first sequence has been replaced by a 16α pulse in the second sequence an overall phase inversion of the whole spectrum produced by the second sequence relative to that of the first sequence will occur. The time delay t in the pulse sequences is set to 68 ms, at which value the lactate doublet at 1.33 ppm is found to become fully inverted.

Figure 1:
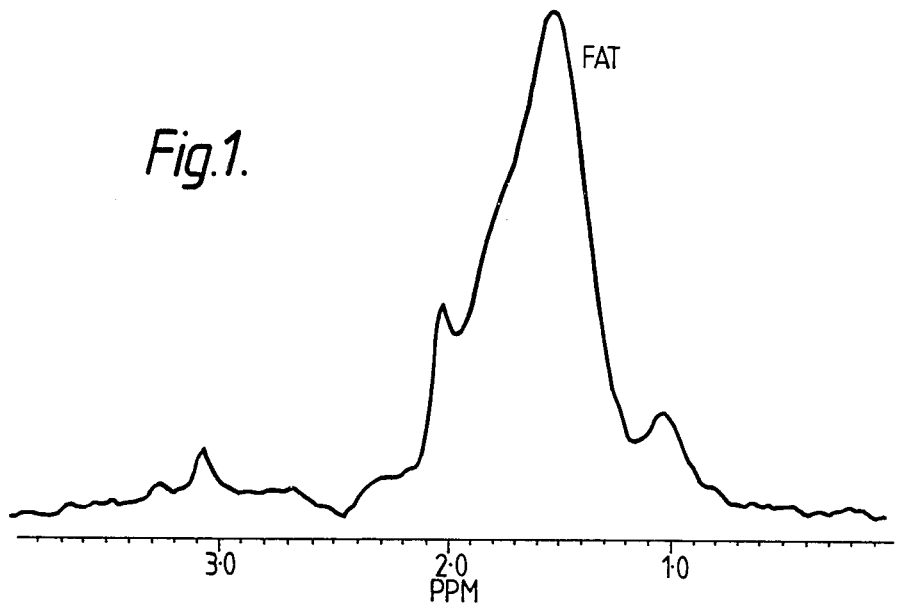
FIG. 1 is an NMR spectrum obtained from the brain of a live rat with the scalp and fur of the rat left intact.

The spectrum obtained as a result of the second sequence is shown in FIG. 1 where it can be seen the fat resonance at 1.43 ppm dominates the spectrum in the region of the lactate doublet at 1.33 ppm.

Figure 2:
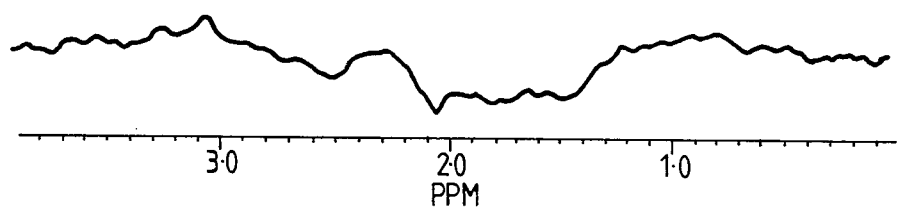
FIG. 2 is an NMR spectrum of the brain of the rat obtained by adding the spectrum shown in FIG. 1 to a second spectrum.
Figure 3:
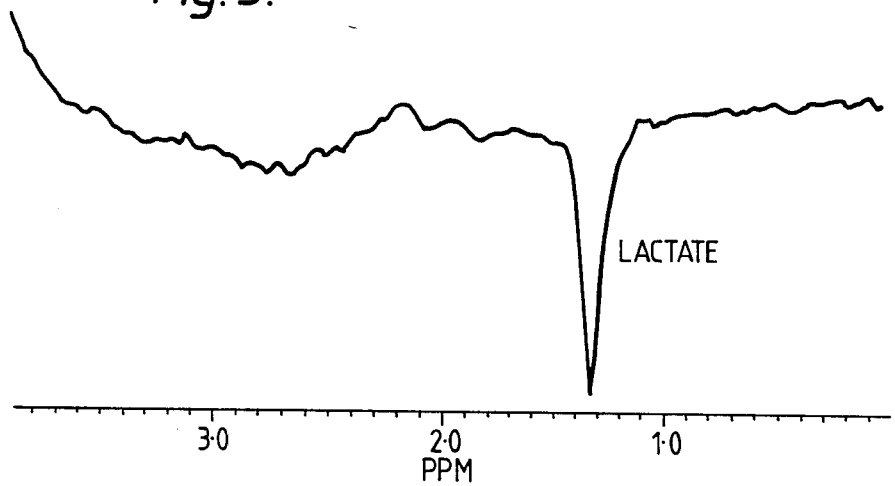
FIG. 3 is an NMR spectrum corresponding to that of FIG. 2, with the spectrum taken 1 hour after the death of the rat.

By adding the two spectra together, the spectrum shown in FIG. 2 is obtained, in which the fat resonance has been substantially totally depleted to reveal virtually no lactate within the rat brain. This result is in contrast to the spectrum shown in FIG. 3 obtained in the same manner to that shown in FIG. 2 but with the two pulse sequences applied 1 hour after the death of the rat. As can be seen the lactate concentration has built up in the brain of the dead rat to produce a prominent lactate resonance at 1.33 ppm.

It will be appreciated that many other pulse sequences in accordance with the invention are possible, for example the sequence:

$$(\alpha - T - \overline{\alpha}) - t - (2\alpha - T - \overline{2\alpha}) - t - \text{acquire}$$

together with the sequence $$(\alpha - T - \overline{\alpha}) - t - (180°) - t - \text{acquire}$$

the use of appropriate delay times T and t causing the addition of the spectrum from the two sequences to suppress both water and fat resonances to provide a measurable signal from the lactate doublet at 1.33 ppm.

It will also be appreciated that suppression of the fat signal is achieved regardless of the accuracy of the inversion pulse so the technique is applicable even if a surface coil is used for transmission of the excitation pulses and reception of the resonance signals.

It will also be appreciated that in order to achieve optimal results, some form of phase cycling, for example the EXORCYCLE phase cycling described in J. Magn. Reson. 27, pages 511–514 published in 1977 will usually be employed.

It will also be appreciated that resonances other than lactate within the sample, for example alanine will also be detected together with the lactate by the above method, which may be advantageous in some situations.

It will also be appreciated that whilst in the method described above by way of example, solvent suppression pulses are used to produce a suppressed resonance signal in the first spectral region, i.e. in the particular example that region including the water resonance and the lactate quartet resonance, if the time period in each sequence which elapses between the excitation pulse and the acquisition period is greater than T2 for the water resonance, which will occur in some tissues such as muscle, the solvent suppression pulses may be omitted.

We claim:

1. An NMR spectroscopy method for monitoring a component of a sample, the component having at least two coupled resonances in different spectral regions, the first resonance lying in a first spectral region including a resonance of a second component of the sample, and the second resonance lying in a second spectral region including a resonance of a third component of the sample, comprising: applying two spin-echo pulse sequences consisting of pulses of a predetermined frequency, the sequences each being effective to produce a suppressed resonance signal in the first spectral region, in one of the sequences the echo pulse not exciting the first resonance, and in the other of the sequences the echo pulse exciting the first resonance; recording a spin-echo spectrum produced by each of the sequences; and using the two recorded spin-echo spectra together to determine the second resonance of the first component with the resonance of the third component suppressed.

2. A method according to claim 1 in which the excitation pulses of both sequences and the echo pulse of said one sequence are all effective to produce an excitation null in the first spectral region, and effective to excite resonance in the second spectral region, the echo pulse of said other sequence being effective to invert the resonances of the first component but not the resonance of the third component.

3. A method according to claim 1 in which solvent suppression pulses are used to produce said suppressed resonance signals in the first spectral region.

4. A method according to claim 3 in which the first spin-echo sequence is $$(\alpha - T - \overline{3\alpha} - T - 3\alpha - T - \overline{\alpha}) - t - (2\alpha - T - \overline{6\alpha} - T - 6\alpha - T - \overline{2\alpha}) - t - \text{acquire}$$

and the second spin-echo sequence is $$(\alpha - T - \overline{3\alpha} - T - 3\alpha - T - \alpha) - t - (16\alpha) - t - \text{acquire.}$$

5. A method according to claim 3 in which the first spin-echo sequence is $$(\alpha - T - \overline{\alpha}) - t - (2\alpha - T - \overline{2\alpha}) - t - \text{acquire}$$

and the second spin-echo sequence is $$(\alpha - T - \overline{\alpha}) - t - (180°) - t - \text{acquire.}$$

6. A method according to claim 1 in which the time period in each said sequence which elapses between the excitation pulses and the acquisition period is greater than T2 for the resonance of the second component.

7. A method according to claim 1 in which the first component is lactate, the second component is water, and the third component is fat.

8. A method according to claim 1 including a form of phase cycling.

* * * * *